United States Patent [19]
Gibb et al.

[11] Patent Number: 5,464,476
[45] Date of Patent: Nov. 7, 1995

[54] PLASMA PROCESSING DEVICE COMPRISING PLURAL RF INDUCTIVE COILS

[75] Inventors: Ian Gibb, Ruislip; Philip Allen, Feltham; Andrew Barnes, Hillingdon, all of England

[73] Assignee: Central Research Laboratories Limited, Middlesex, United Kingdom

[21] Appl. No.: 324,191

[22] Filed: Oct. 17, 1994

[30] Foreign Application Priority Data

Oct. 19, 1993 [GB] United Kingdom ............. 9321489

[51] Int. Cl.$^6$ .................... C23C 16/30; C23C 16/50; C23C 16/54
[52] U.S. Cl. ................. 118/723 MP; 118/723 I; 118/718; 118/719; 156/345
[58] Field of Search ............................ 118/718, 719, 118/723 AN, 723 I, 723 IR; 156/345

[56] References Cited

U.S. PATENT DOCUMENTS

| | | | |
|---|---|---|---|
| H 566 | 1/1989 | Nyaiesh et al. ............ | 118/723 IR X |
| 4,320,716 | 3/1982 | Boulanger et al. ............ | 118/723 IR X |
| 4,440,108 | 4/1984 | Little et al. ............ | 118/723 IR X |
| 4,623,417 | 11/1986 | Spencer et al. ............ | 118/723 I X |
| 4,948,458 | 8/1990 | Ogle ............ | 156/345 X |
| 5,226,967 | 7/1993 | Chen et al. ............ | 156/345 X |
| 5,261,962 | 11/1993 | Hamamoto et al. ............ | 156/345 X |
| 5,277,751 | 1/1994 | Ogle ............ | 156/345 X |
| 5,280,154 | 1/1994 | Cuomo et al. ............ | 156/345 X |
| 5,304,279 | 4/1994 | Coultas et al. ............ | 118/723 I X |

FOREIGN PATENT DOCUMENTS 54-40394  12/1979  Japan ........................... 118/723 I

*Primary Examiner*—R. Bruce Breneman
*Assistant Examiner*—Jonathan D. Baskin
*Attorney, Agent, or Firm*—Keck, Mahin & Cate

[57] ABSTRACT

A plasma processing device is described which is modular and can be scaled up by assembly together with similar devices to provide a capability for large area processing. The device includes a housing which contains an array of RF coils and into which a process gas is fed. The article to be processed is disposed close to the housing and egress of the process gas from the housing to the process region is resisted so as to maintain a positive pressure differential between the housing and the process region.

7 Claims, 3 Drawing Sheets

PLASMA PROCESSING DEVICE COMPRISING PLURAL RF INDUCTIVE COILS

This invention relates to plasma processing and, more particularly, to a module for mounting within a process chamber (equipped with a vacuum system) for the purpose of plasma processing of insulating materials. Plasma processing typically involves deposition of material onto substrate surfaces or the etching/modification of those surfaces, but can involve other operations either additionally to or alternatively to such operations.

It is known, for example from U.S. Pat. No. 4,948,458, that a spiral electrode mounted on the outside of an insulating wall of a vacuum system is suitable for performing plasma etching through inductive coupling. However, difficulties with the scale-up to larger processing areas have been reported due to the size of the inductance required. This is in addition to the usual scale-up problem of process parameters depending strongly on chamber geometry due to the effects of walls, flow patterns of reactive gases etc. An object of this invention is to address these problems through the use of module(s) consisting of a number of small coils; each module being optimised for uniform plasma generation and containing an integral gas feed supply.

Another object of this invention is to provide a plasma processing device utilising inductive coupling which has advantages over conventional arrangements due to its inherent modularity which allows easy scale-up from laboratory to commercial sizes. Each module consists of several coils arranged for plasma uniformity, with power and gas feeds.

According to the invention there is provided a plasma processing device comprising a housing with a wall member overlying a substrate to be operated on by means of a plasma process but separated therefrom by a discharge gap, the device comprising a plurality of inductive coils distributed over said wall member, means for supplying RF energy to the coils, means for introducing a process gas into said housing and causing said gas to flow into the discharge gap, said wall member and/or said housing being constructed to resist the flow of said gas so as to maintain in said housing a higher pressure of said gas than exists in said discharge gap.

BRIEF DESCRIPTION OF DRAWINGS

Referring to FIG. 1, the module takes the form of a box 1 installed inside a process chamber (vacuum system), which is not shown, the box 1 being positioned, in this case, directly above a moving flat substrate 2 which could be glass, a plastic or another insulating material. The top of the module contains feeds 3, 4 respectively allowing the supply of RF power (preferably though not exclusively at a frequency of 13.56 MHz) and process gas e.g., methane for deposition of carbon films. The module surface closest to the substrate, termed the bottom plate 5 in the figure, is made from an insulating material and is perforated with many small holes such as 6 (preferably in the range 10–100 μm diameter) such that process gas passes through with difficulty and a significant pressure differential can thus be established between the gas feed and the process chamber (the latter preferably in the region 0.5–10 mbar). Also on the bottom plate (inside the module) is an arrangement of conducting coils such as 7 to which the RF power is supplied. When sufficient power is supplied, inductively coupled discharges form in the gap 8 between the bottom plate 5 and substrate 2 allowing plasma modification (deposition in this example) to take place. Discharges do not form inside the module due to the much higher gas pressure and the use of suitable insulation (not shown) around the coils. Since the feed gas is continually being replenished close to the source, there is little risk of exhaustion of reactive species even at very high powers. The geometrical arrangement of coils, i.e., size, number and pattern, and their electrical inter-connection can be worked out empirically or theoretically for generation of plasma exhibiting a desired degree of uniformity over the module bottom surface.

Figure 1:
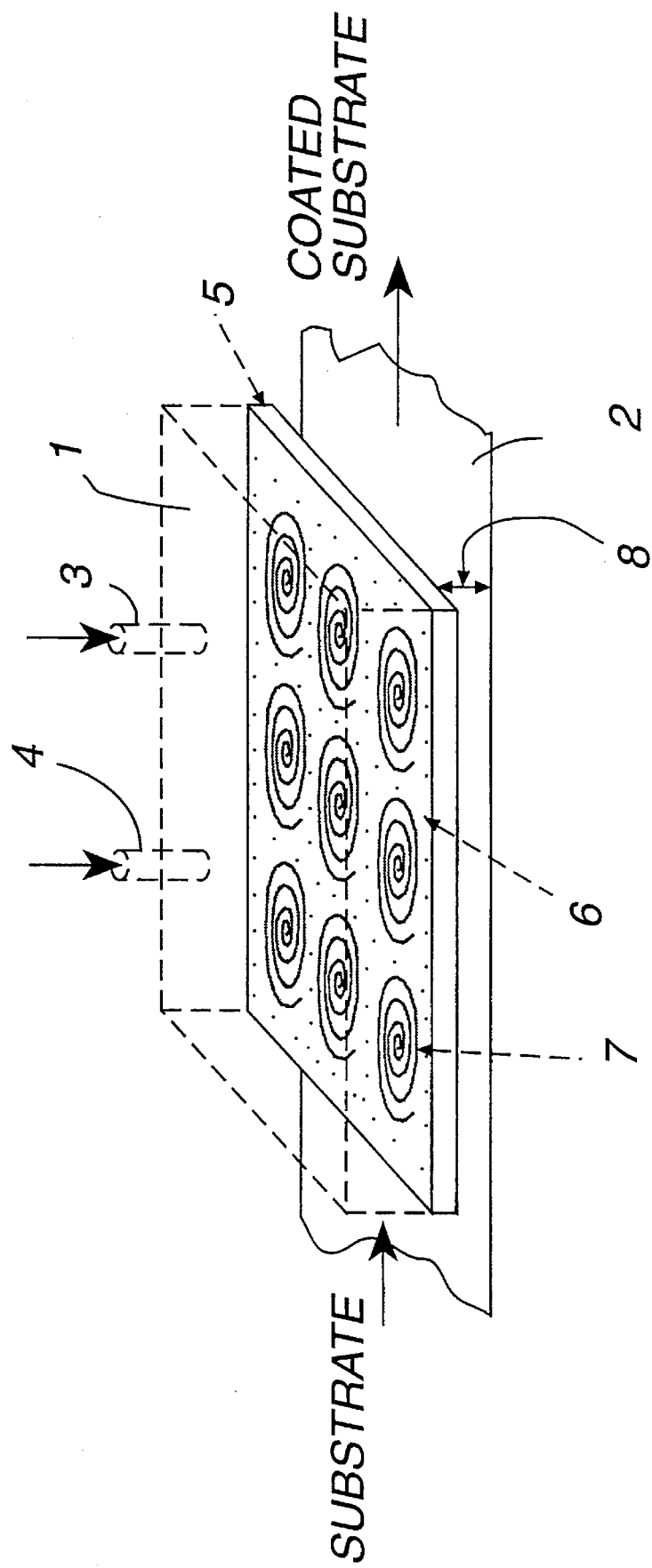
FIG. 1 shows schematically an arrangement for a processing module.

Since each module has its own separate power and gas feed, it can be readily perceived that many modules can be run together with little interaction. Scale-up of any plasma process can thus be achieved by tessellation of the appropriate number of modules. This could be a 1 dimensional (1-D) array for treating a moving sheet of any width, or a 2-D array for a stationary object of any size. In the former case, a further development would be the use of a 2-D array which could allow longer exposure to the plasma (e.g., larger deposited film thickness or etch depth) or differing processes to be carried out in series (e.g., different materials deposited, or etching followed by deposition). Individual control of modules allows the possibility of spatial and/or temporal gradation in deposited film characteristics such as composition or structure.

Other embodiments of the invention may use a bottom plate constructed of, or including, one or more regions of a material which is inherently gas permeable. Any RF drive circuitry or impedance matching circuits, as understood by those skilled in the art, may also be incorporated within the module, such that only a supply of DC or mains electricity is necessary. Further, the box structure need not be rectangular but it may take any convenient shape to conform with the required processing operation.

In another embodiment, the box structure may contain baffles which resist the flow of gas to a desired extent but do not significantly impede the distribution of RF energy to the inductive coils such as 7. In that case larger apertures can be used in the bottom plate 5 of the box 1.

Those skilled in the art will readily perceive various modifications to the device shown in the drawing and described herein, and it is intended that such modifications shall be within the scope of the present invention.

Figure 2:
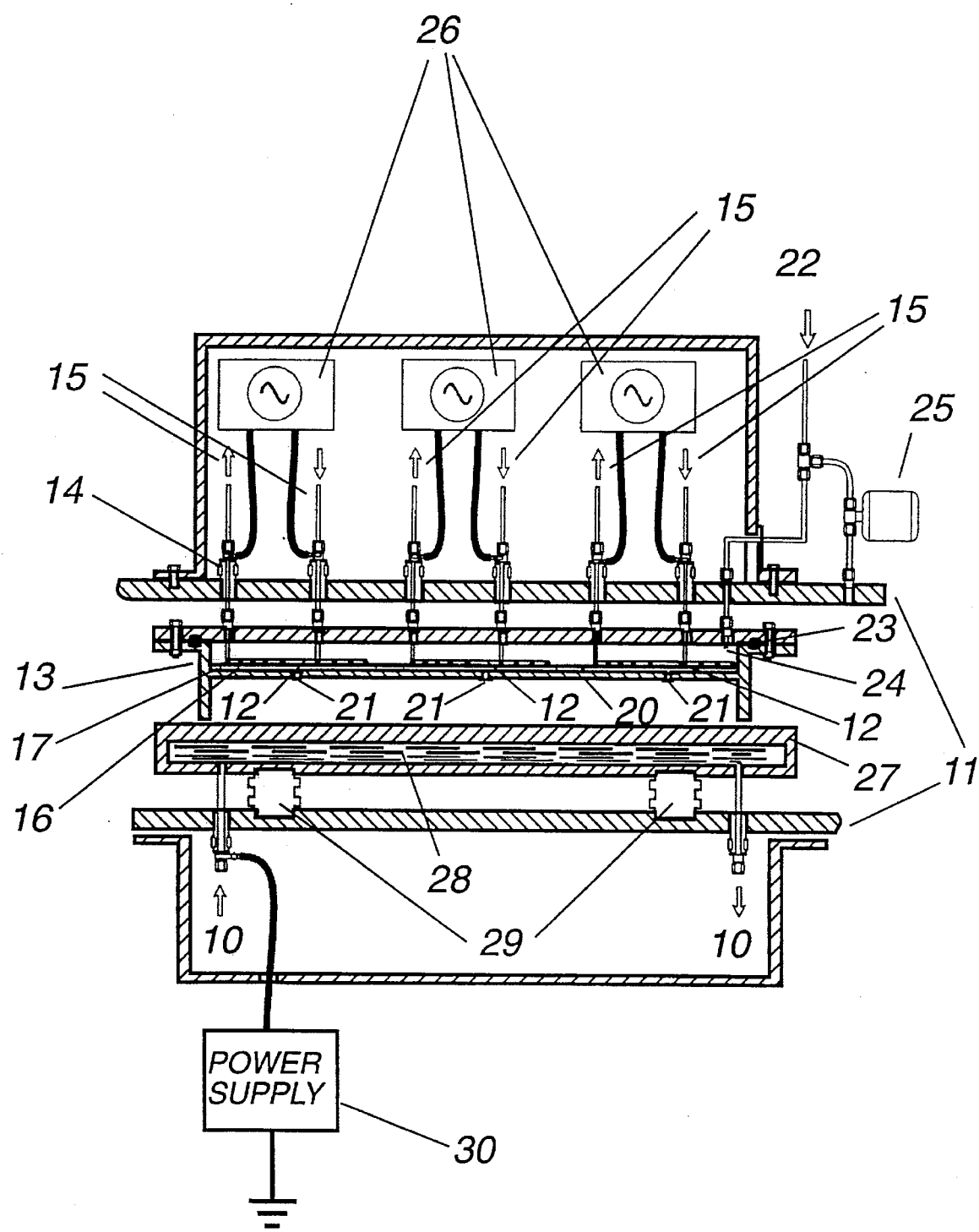
FIGS. 2, 3 and 4 show a second embodiment of the invention.

FIG. 2 shows, in cross sectional view, a large area reactor built in accordance with the principles described previously. The plasma treatment takes place in a vacuum chamber 11 connected, in known manner, with a vacuum system (not shown) of a kind that will operate with a high throughput of gas at the pressures of interest. Typically, such systems will utilise throttled-back diffusion pumps or Roots pumps.

Multiple spiral coils 12 are positioned in an array, as described previously, within a dielectric enclosure 13. Typically, the enclosure 13 is constructed of ceramic, glass ceramic, fused silica or quartz, although other materials may be used.

The spiral coils 12 are supported by insulative feedthrough devices 14 and may be cooled by means of a fluid, a typical direction of flow of which is indicated by the arrows 15. Typical cooling fluids suitable for use in this application are air, inert gases, water or an insulative medium such as fluorocarbon.

Figure 3:
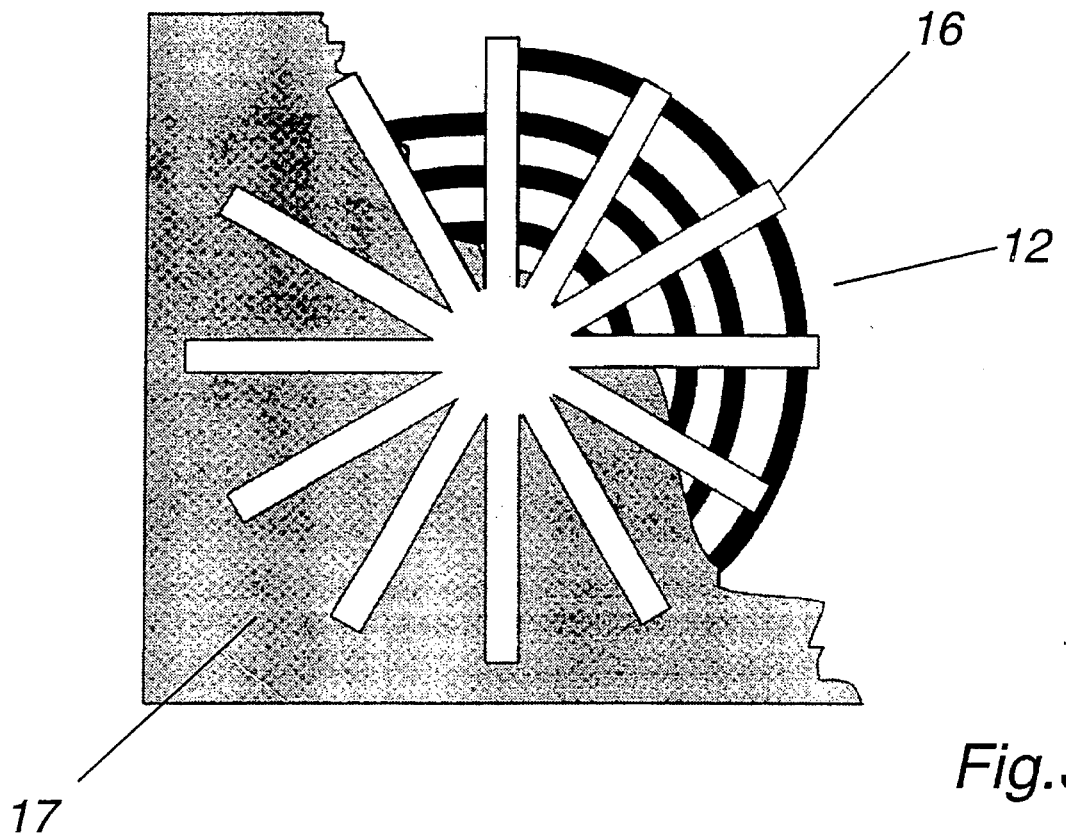

Underlying each of the coils 12 and screening its radial electric fields is a spoke like conductor configuration 16 (seen in more detail in FIG. 3). The configurations 16 are provided in order to avoid sputtering of the enclosure 13 which could otherwise arise as a result of ions being accelerated by the radial fields. The conductor configurations 16 are separated from their respective coils by dielectric sheet material 17.

Figure 4:
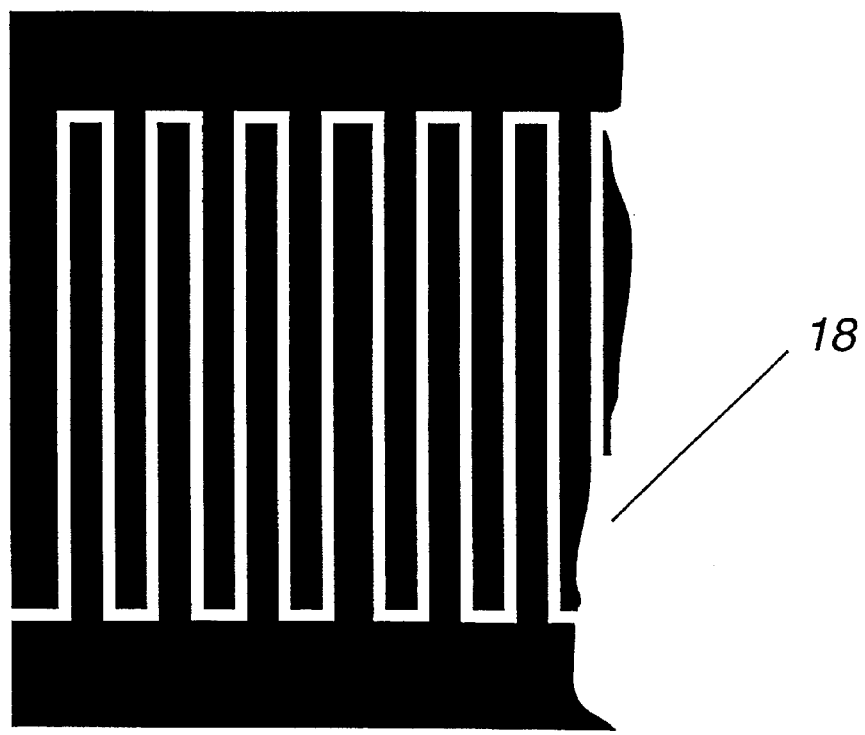

Instead of the conductor configuration 16, the radial fields may be screened by means of a structure such as that shown in FIG. 4 at 18. This comprises a conductive material with a meandering slot to form an interdigitated conductor arrangement. It is fitted to the underside of the base 20 of the enclosure 13 and held at a fixed, positive potential with respect to the plasma.

The base 20 is fitted with inserts 21 which allow a working gas, applied as shown by the arrow 22, into the reactor chamber 11. The inserts 21 may be formed with microscopic holes or be of a porous material such as low density ceramic. Alternatively, as mentioned previously, the entire base 20 (or certain sections of it) may be perforated with microscopic holes. For ease of maintenance, the enclosure 13 is demountable and sealed with a gasket 23.

Gas is fed into the enclosure 13 via an inlet tube 24 from a gas handling system, the line being equipped with a by-pass valve 25 to evacuate the enclosure during the pump-down of the main reactor chamber.

The coils are supplied with radio frequency power from power supply/matching network modules 26 which use similar techniques to induction heaters to separate RF power and cooling fluids. Adjustment of the power in individual coils is used to compensate for edge effects giving an improvement in uniformity of coating or surface treatment over the prior art.

In certain applications the reactor is fitted with a substrate platen 27 which may be cooled by fluid 28: the platen may share cooling fluids with the coils. To enable RF or DC bias to be applied, the platen is supported on insulators 29. A power supply 30 is used to apply RF or DC bias.

We claim:

1. A plasma processing device comprising a housing with a wall member overlying a substrate to be operated on by means of a plasma process but separated therefrom by a discharge gap, the device comprising a plurality of inductive coils distributed over said wall member, means for supplying RF energy to the coils, means for introducing a process gas into said housing and causing said gas to flow into the discharge gap, said wall member and/or said housing being constructed to resist the flow of said gas so as to maintain in said housing a higher pressure of said gas than exists in said discharge gap.

2. A device according to claim 1 wherein said wall member is formed, in at least one region thereof, with holes dimensioned to resist said gas flow to a desired extent.

3. A device according to claim 1 wherein said wall member incorporates one or more inserts made of a porous material which resists said gas flow to a desired extent.

4. A device according to claim 1 including transport means for moving said substrate relative to said housing in a direction substantially parallel to said wall member.

5. A device according to claim 1 including shielding means for screening unwanted electric fields generated by said coils.

6. A device according to claim 5 wherein said shielding means comprises a respective spoke-shaped conductor configuration juxtaposed with each of said coils and electrically insulated therefrom.

7. A processing arrangement comprising a plurality of devices as claimed in claim 1 assembled together and operable in concert.

* * * * *